(12) United States Patent
Yamaguchi

(10) Patent No.: US 10,886,211 B2
(45) Date of Patent: Jan. 5, 2021

(54) WIRING BOARD AND SEMICONDUCTOR PACKAGE

(71) Applicant: SHINKO ELECTRIC INDUSTRIES CO., LTD., Nagano (JP)

(72) Inventor: Yasuyuki Yamaguchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/373,951

(22) Filed: Apr. 3, 2019

(65) Prior Publication Data
US 2019/0311982 A1  Oct. 10, 2019

(30) Foreign Application Priority Data

Apr. 5, 2018 (JP) ................................ 2018-073456

(51) Int. Cl.
*H01L 23/49* (2006.01)
*H01L 23/498* (2006.01)

(52) U.S. Cl.
CPC .. *H01L 23/49866* (2013.01); *H01L 23/49827* (2013.01)

(58) Field of Classification Search
CPC ............... H01L 23/49866; H01L 23/49827
See application file for complete search history.

(56) References Cited

U.S. PATENT DOCUMENTS

| 6,627,824 | B1* | 9/2003 | Lin ................... H01L 21/4853 174/262 |
| 2011/0233793 | A1* | 9/2011 | Miura ................ B23K 1/0016 257/779 |
| 2012/0064712 | A1* | 3/2012 | Lei ................... H01L 21/67028 438/614 |
| 2013/0098670 | A1 | 4/2013 | Inoue et al. |
| 2014/0138134 | A1* | 5/2014 | Imafuji .................. H05K 1/11 174/257 |

FOREIGN PATENT DOCUMENTS

| JP | 2013-093405 | 5/2013 |
| JP | 2014-103295 | 6/2014 |
| JP | 2016-035969 | 3/2016 |

\* cited by examiner

*Primary Examiner* — Fernando L Toledo
*Assistant Examiner* — Valerie N Newton
(74) *Attorney, Agent, or Firm* — Rankin, Hill & Clark LLP

(57) ABSTRACT

A wiring board includes: a Cu pad; an insulating layer covering the Cu pad and having an opening portion; a first metallic layer formed on the Cu pad in the opening portion; and a connecting terminal formed on the first metallic layer to extend from the opening portion to above an upper surface of the insulating layer. The connecting terminal includes: a seed layer formed on the first metallic layer; and a second metallic layer formed on the seed layer. A stacked body is formed of the first metallic layer and the connecting terminal and includes a constricted portion. The constricted portion is located in a certain position of the first metallic layer in a thickness direction of the first metallic layer, and a sectional area of the stacked body is the smallest at the constricted portion.

8 Claims, 11 Drawing Sheets

WIRING BOARD AND SEMICONDUCTOR PACKAGE

This application claims priority from Japanese Patent Applications No. 2018-073456 filed on Apr. 5, 2018, the entire contents of which are herein incorporated by reference.

BACKGROUND

1. Technical Field

This disclosure relates to a wiring board and a semiconductor package.

2. Background Art

In a wiring board, a Cu post is connected to a copper (Cu) pad as a connecting terminal. Then, when mounting an electronic component such as a semiconductor chip on the wiring board, a solder ball is used to join the Cu post and a conductive pad of the electronic component (for example, see JP-A-2013-93405, JP-A-2016-35969 and JP-A-2014-103295).

In recent years, high performance, high functionality, and miniaturization have been demanded more and more for electronic components. Then, to meet these demands, connecting terminals for wiring boards are desired to be minute. However, with a minute connecting terminal, a failure such as a crack tends to be generated in a Cu pad. Then, when the Cu pad is damaged, a protective insulating layer on the periphery of the Cu pad may be damaged accordingly.

An object of this disclosure is to provide a wiring board and a semiconductor package which can prevent the occurrence of a Cu pad failure which is triggered by the miniaturization of a connecting terminal.

SUMMARY

Certain embodiments provide a wiring board comprising:
a Cu pad;
an insulating layer covering the Cu pad and having an opening portion formed on the Cu pad;
a first metallic layer formed on the Cu pad in the opening portion, wherein an elastic modulus of the first metallic layer is higher than that of the Cu pad; and
a connecting terminal formed on the first metallic layer to extend from the opening portion to above an upper surface of the insulating layer;
wherein the connecting terminal comprises:
a seed layer formed on the first metallic layer; and
a second metallic layer formed on the seed layer, and
wherein a stacked body formed of the first metallic layer and the connecting terminal comprises a constricted portion, and
wherein the constricted portion is located in a certain position of the first metallic layer in a thickness direction of the first metallic layer, and a sectional area of the stacked body is the smallest at the constricted portion.

Certain embodiments provide a wiring board comprising:
a metallic pad;
an insulating layer covering the metallic pad and having an opening portion formed on the metallic pad;
a first metallic layer formed on the metallic pad in the opening portion, wherein an elastic modulus of the first metallic layer is higher than that of the metallic pad; and
a connecting terminal formed on the first metallic layer to extend from the opening portion to above an upper surface of the insulating layer,
wherein the connecting terminal comprises:
a seed layer formed on the first metallic layer; and
a second metallic layer formed on the seed layer, and
wherein a stacked body formed of the first metallic layer and the connecting terminal comprises a constricted portion, and
wherein the constricted portion is located in a certain position of the first metallic layer in a thickness direction of the first metallic layer, and a sectional area of the stacked body is the smallest at the constricted portion.

DETAILED DESCRIPTION

The inventor has made every possible effort to study the cause for the Cu pad failure associated with the miniaturization of connecting terminals. Then, as a result of the detailed analysis of the cause by the inventor, it has been made clear that great stress tends to be applied to the vicinity of an interface between a connecting terminal and a Cu pad when mounting an electronic component and that particularly great stress is applied to the interface with a connecting terminal of which a diameter reduces from an upper end towards a lower end of the connecting terminal. Hereinafter, the newly found fact will be described.

Figure 1:
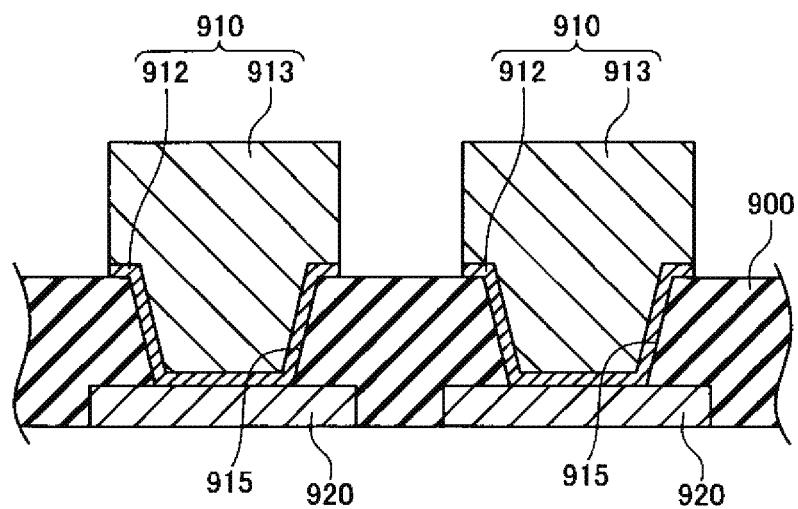
FIG. 1 is a sectional view showing an example of a connecting terminal.

FIG. 1 is a sectional view showing an example of a connecting terminal. As shown in FIG. 1, in this example, via holes 915 are formed in a solder resist layer 900 to reach Cu pads 920. The via holes 915 are formed by shining a laser beam on the solder resist layer 900, and a diameter of the via hole 915 reduces from an upper end towards a lower end thereof. Then, connecting terminals 910 which are connected to the Cu pads 920 are formed in the via holes 915. The connecting terminal 910 includes a Cu seed layer 912 and a Cu plating layer 913 formed on the Cu seed layer 912.

When mounting an electronic component such as a semiconductor chip, a load is exerted on the connecting terminal 910, and great stress is applied to the vicinity of an interface between the connecting terminal 910 and the Cu pad 920 where a sectional area of the connecting terminal 910 becomes the smallest. Then, in the event that the Cu pad 920 cannot withstand the stress, a failure such as a crack is generated in the Cu pad 920.

Figure 2:
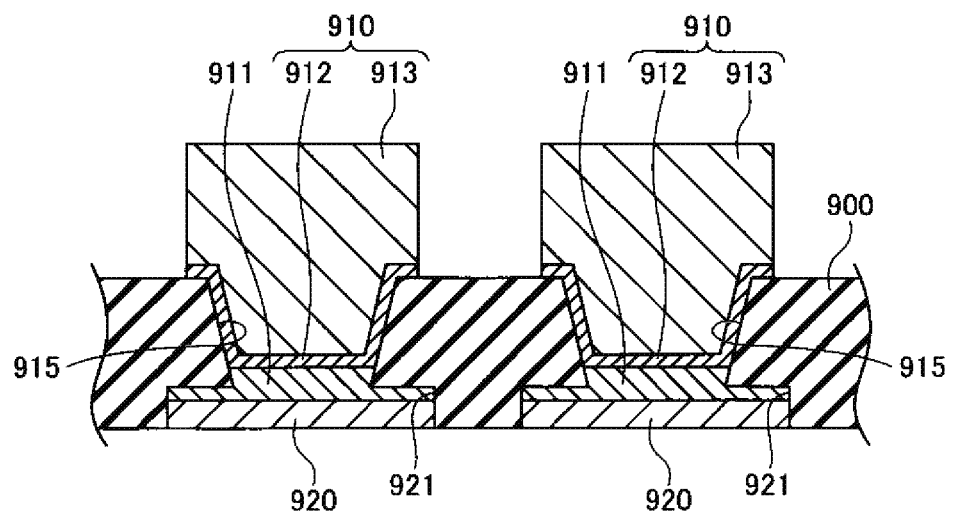
FIG. 2 is a sectional view showing another example of a connecting terminal.

The inventor has made further every possible effort to suppress the occurrence of such a failure, as a result of which it has been made clear that the failure of the Cu pad 920 occurring when the electronic component is mounted can be prevented by providing a metallic layer 911 having a higher elastic modulus than that of the Cu pad 920 at a portion where the sectional area of the connecting terminal 910 becomes the smallest and great stress tends to be applied, and providing the connecting terminal 910 on the metallic layer 911, as shown in FIG. 2.

The inventor and others have reached the following embodiment based on the newly found fact described above. Hereinafter, referring to accompanying drawings, the embodiment will be described specifically. In this specification and the drawings, like reference signs will be given to constituent elements having substantially like functions or configurations, whereby the repetition of like descriptions will be omitted from time to time.

First Embodiment

A first embodiment will be described. The first embodiment relates to a wiring board.

Structure of Wiring Board

Figure 3:
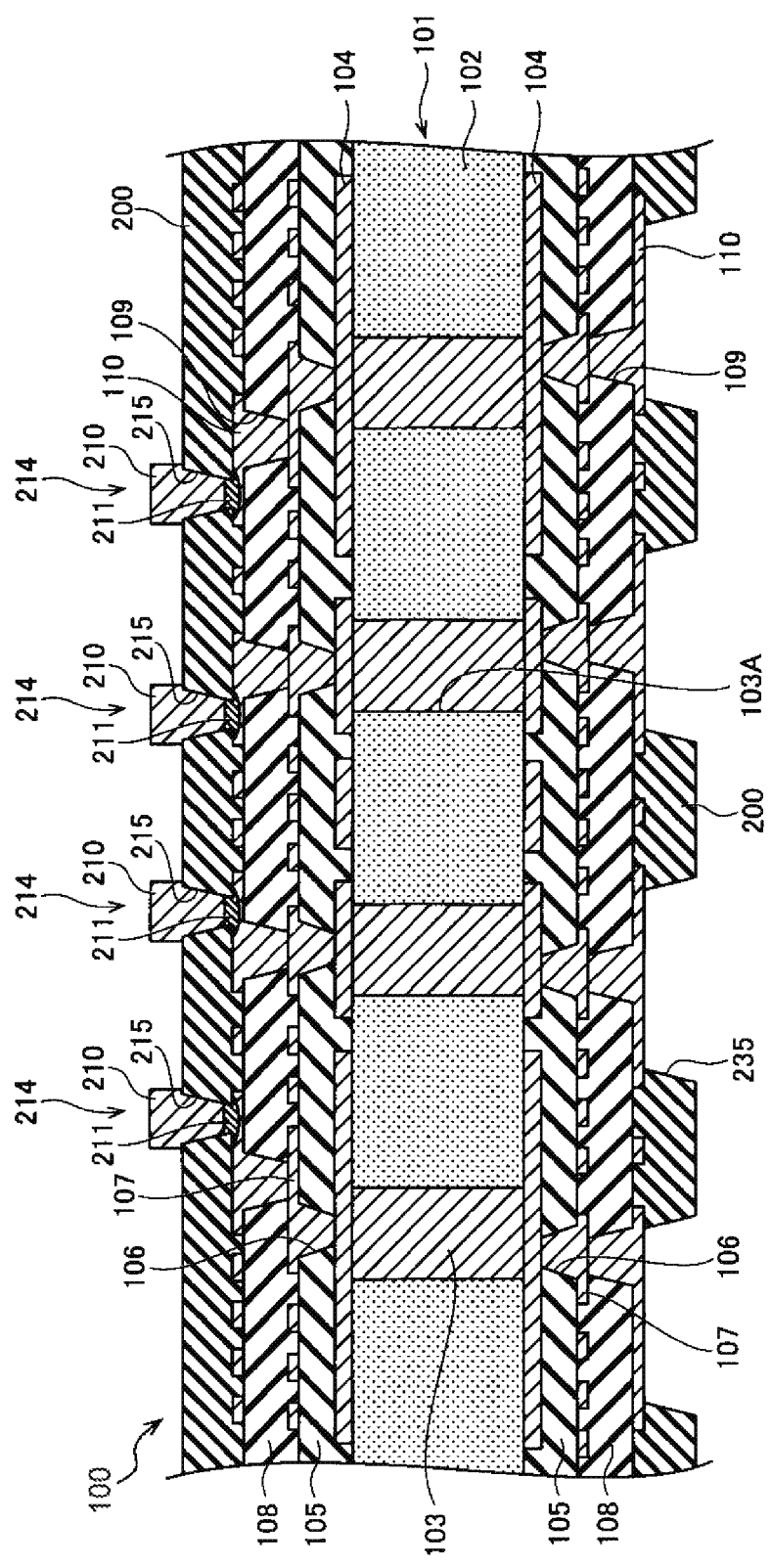
FIG. 3 is a sectional view showing the structure of a wiring board according to a first embodiment.
Figure 4:
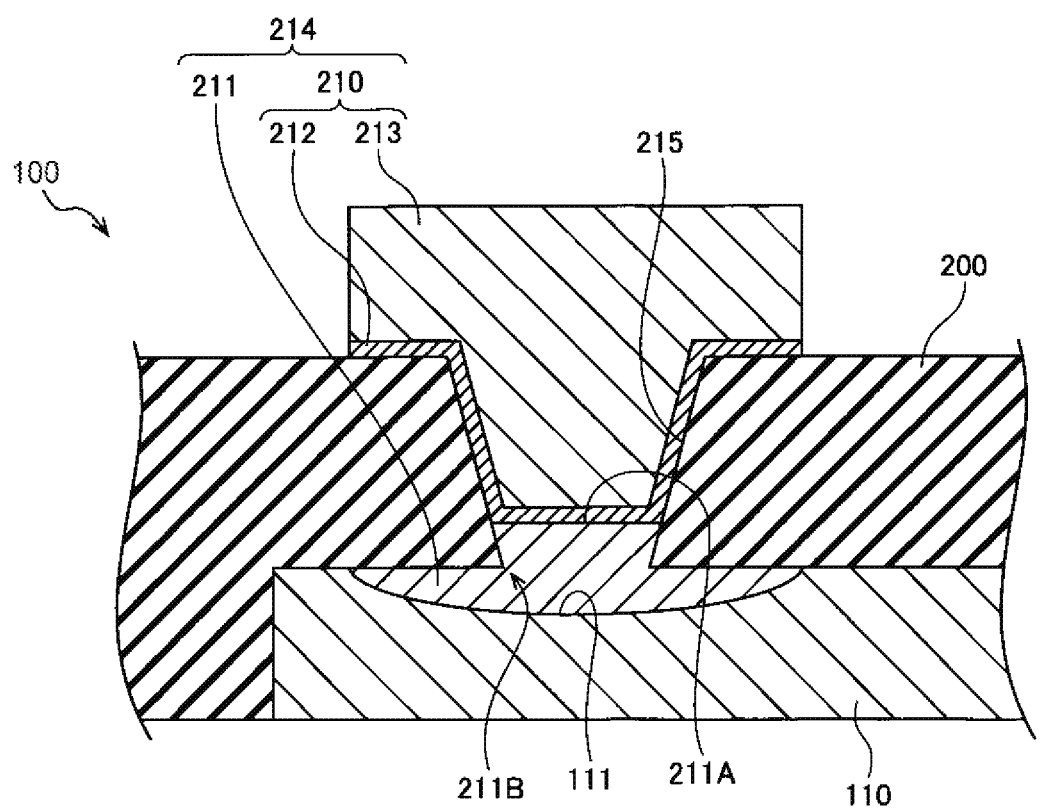
FIG. 4 is a sectional view showing the structure of a connecting terminal included in the wiring board according to the first embodiment.

Firstly, the structure of a wiring board according to a first embodiment will be described. FIG. 3 is a sectional view showing the structure of the wiring board according to the first embodiment. FIG. 4 is a sectional view showing the structure of a connecting terminal included in the wiring board according to the first embodiment.

As shown in FIG. 3, a wiring board 100 according to the first embodiment includes a core wiring board 101 as a substrate. The core wiring board 101 includes a core substrate 102 which is formed of an insulation material such as a glass epoxy resin. A first wiring layer 104 formed of Cu or the like is formed on both surfaces of the core substrate 102. Through holes 103A are formed in the core substrate 102 in such a manner as to penetrate the core substrate 102 in a thickness direction, and a through conductor 103 is provided in the through holes 103A. The first wiring layers 104 at both sides of the core substrate 102 are connected to each other via the through conductors 103. A through-hole plating layer may be formed on a side wall of the through hole 103A, and a resin material may be provided in the remaining hole portion of the through hole 103A. In this case, the first wiring layers 104 at both the sides of the core substrate 102 are connected to each other via the through-hole plating layers.

A first insulating layer 105 is formed on both sides of the core substrate 102. Via holes 106 are formed in the first insulating layers 105 in such a manner as to reach connecting portions of the first wiring layers 104, and second wiring layers 107 are formed on the corresponding first insulating layers 105 in such a manner as to be connected to the corresponding first wiring layers 104 by way of via conductors in the via holes 106. The second wiring layers 107 are formed of Cu. Further, a second insulating layer 108 is formed on the first insulating layer 105 on both sides of the core substrate 102. Via holes 109 are formed in the second insulating layers 108 in such a manner as to reach connecting portions of the second wiring layers 107, and a third wiring layer 110, which is formed of Cu, is formed on the second insulating layers 108 to be connected to the corresponding second wiring layer 107 by way of via conductors in the via holes 109.

A solder resist layer 200 is formed on the second insulating layer 108 on both side of the core substrate 102. Via holes 215 are formed in the solder resist layer 200 on the side of the core substrate 102 where a semiconductor chip is connected in such a manner as to reach connecting portions of the third wiring layer 110. The connecting portions of the third wiring layer 110 are used as Cu pads. The diameter of the via holes 215 reduces from an upper end towards a lower end thereof. Opening portions 235 are formed in the solder resist layer 200 on the opposite side of the core substrate 102 in such a manner as to reach connecting portions of the third wiring layer 110.

As shown in FIG. 4, a recess 111 is formed in a surface of the third wiring layer 110 on the side of the core substrate 102 where it is connected with a semiconductor chip, in such a manner as to continue to the via hole 215, and a nickel (Ni plating layer 211 is formed in such a manner as to fill the recess 111. For example, a thickness of the Ni plating layer 211 is in a range of 5 μm to 10 μm. An upper surface 211A of the Ni plating layer 211 lies above a lower end of the via hole 215. A Cu post 210 is formed to extend as high as above the solder resist layer 200 through the via hole 215. The Cu post 210 has a Cu seed layer 212 and a Cu plating layer 213 resting on the Cu seed layer 212. The Ni plating layer 211 is an example of a first metallic layer, the Cu seed layer 212 is an example of a seed layer, the Cu plating layer 213 is an example of a second metallic layer, and the Cu post 210 is an example of a connecting terminal. A palladium (Pd) plating layer and a gold (Au) plating layer are preferably formed between the Ni plating layer 211 and the Cu seed layer 212.

A stacked body 214 of the Ni plating layer 211 and the Cu post 210 has a constricted portion 211B. A sectional area of the stacked body 214 becomes the smallest at the constricted portion 211B that is located at a certain position in a thickness direction of the Ni plating layer 211. That is, a sectional area of the stacked body 214 becomes the smallest at a portion corresponding to the lower end of the via hole 215, and the stacked body 214 is constricted at this portion. Then, a portion of the Ni plating layer 211 which is situated below the constricted portion 211B resides within the recess 111, and the Ni plating layer 211 comes into contact with a lower surface of the solder resist layer 200 which faces the recess 111.

In this way, in this embodiment, the Ni plating layer 211 is interposed between the third wiring layer 110, of which the connecting portion is used as a Cu pad, and the Cu post 210, and the portion of the stacked body 214 where the sectional area becomes the smallest resides within the Ni plating layer 211. Then, the Ni plating layer 211 has a higher elastic modulus than those of the third wiring layer 110 and the Cu post 210. When referred to herein, the elastic modulus is defined as a concept including Young's modulus and rigidity modulus. Consequently, a high strength can be obtained when compared with a case where the Cu post 210 is formed directly on the third wiring layer 110, and even though a load is exerted on the Cu post 210 when mounting an electronic component, the occurrence of a failure such as a crack in the third wiring layer 110 can be prevented. Additionally, by preventing the occurrence of a failure of the third wiring layer 110, the occurrence of a failure of the solder resist layer 200 can also be suppressed.

Wiring Board Fabrication Process

Next, a wiring board fabrication process will be described. FIGS. 5A to 7B are sectional views showing a wiring board fabrication process according to the first embodiment.

Figure 5A:
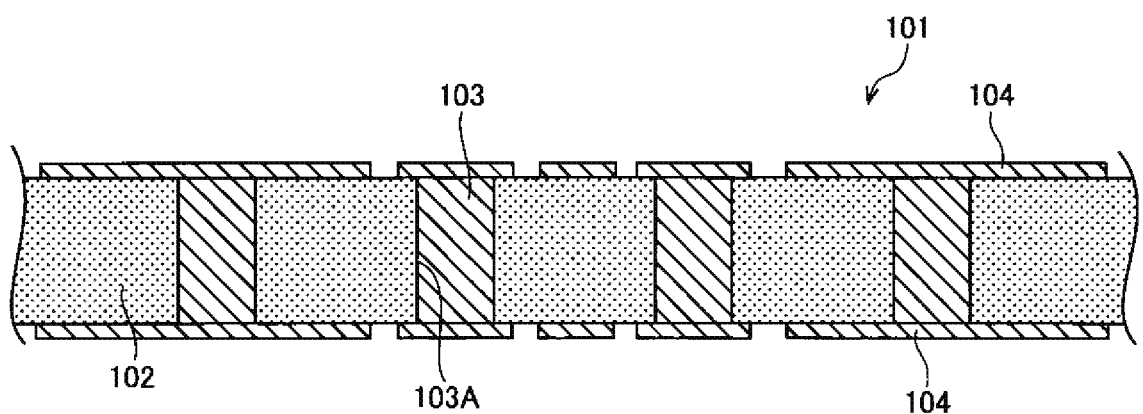
FIG. 5A is a sectional view showing a fabrication process of the wiring board according to the first embodiment.

Firstly, as shown in FIG. 5A, a core wiring board 101, functioning as a substrate, is prepared. The core wiring board 101 includes a core substrate 102 and first wiring layers 104. Through holes 103A, which penetrate the core substrate 102 in a thickness direction, are formed in the core substrate 102, and through conductors 103 are provided. in the through holes 103A. For example, the through holes 103A can be formed through machining using a drill, and the through conductors 103 and the first wiring layers 104 can be formed through a plating process and a photo-lithography, respectively.

Figure 5B:
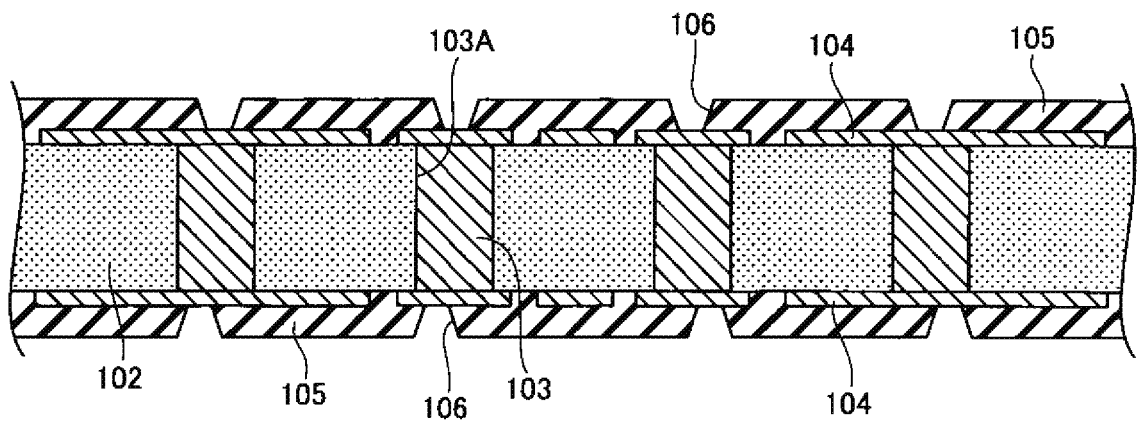
FIG. 5B is a sectional view showing the fabrication process of the wiring board according to the first embodiment.

Next, as shown in FIG. 5B, an uncured resin film is affixed to both sides of the core substrate 102 and is then heat treated to be cured, whereby a first insulating layer 105 is formed. The first insulating layer 105 is formed of an epoxy resin or a polyimide resin. The first insulating layer 105 may be formed by applying a liquid resin. Thereafter, via holes 106 are formed in the insulating layers 105 in such a manner as to reach connecting portions of the first wiring layers 104 by machining the first insulating layers 105 on both sides of the core substrate 102 with a laser beam.

Figure 6A:
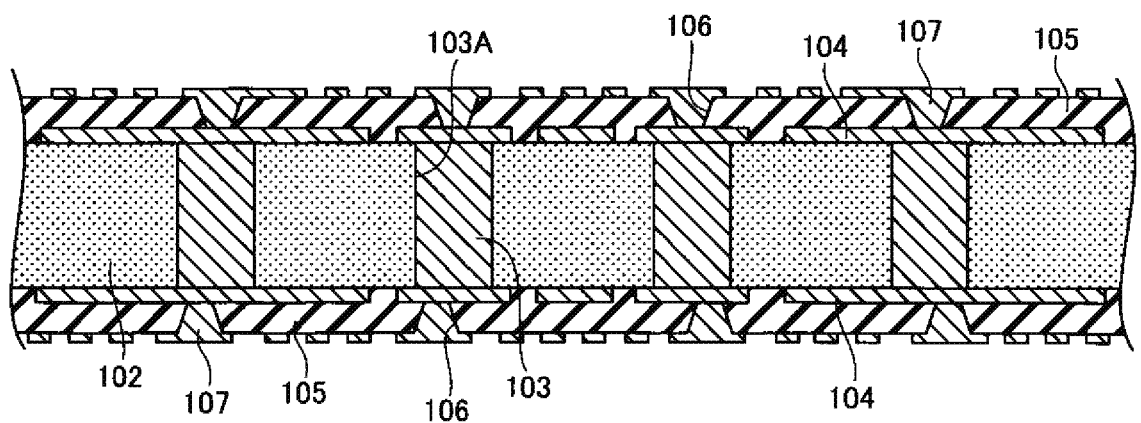
FIG. 6A is a sectional view showing the fabrication process of the wiring board according to the first embodiment.

Following this, as shown in FIG. 6A, second wiring layers 107 are formed on the corresponding first insulating layer 105 on both sides of the core substrate 102 in such a manner as to be connected to the corresponding first wiring layer 104 by way of via conductors in the corresponding via holes 106.

The second wiring layers 107 can be formed by a semi-additive process. Here, a forming process of the second wiring layers 107 will be described in detail. Firstly, a seed layer of Cu (not shown) is formed on the first insulating layer 105 and inner surfaces of the via holes 106 through an electroless plating process or a spattering process. Next, a plating resist layer (not shown) is formed in which opening portions are provided at portions where second wiring layers 107 are formed. Following this, a metallic plating layer of Cu is formed on the opening portions in the plating resist layer by an electrolytic plating process in which the seed layer is used as a plating power feeding path. Thereafter, the plating resist layer is removed. Next, the seed layer is removed through wet etching using the metallic plating layer as a mask. In this way, the second wiring layers 107 including the seed layer and the metallic plating layer can be formed.

Figure 6B:
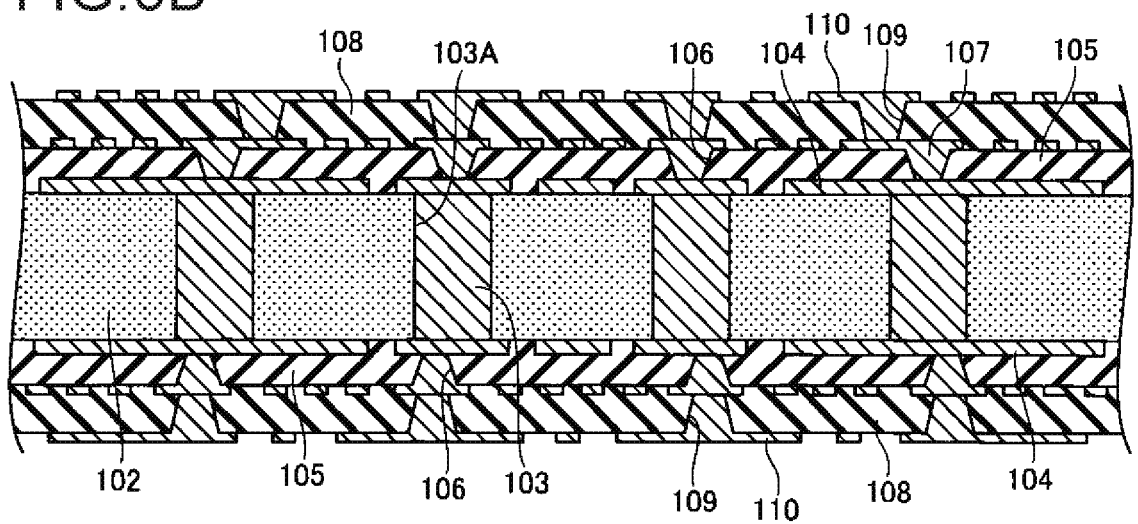
FIG. 6B is a sectional view showing the fabrication process of the wiring board according to the first embodiment.

After the second wiring layers 107 are formed, as shown in FIG. 6B, a second insulating layer 108, in which via holes 109 are provided on connecting portions of the second wiring layers 107, is formed on the first insulating layer 105 on both sides of the core substrate 102. The second insulating layer 108 can be formed using a process similar to the process by which the first insulating layer 105 is formed.

Further, as shown in FIG. 6B, third wiring layers 110, which are connected to the corresponding second wiring layers 107 by way of via conductors in the via holes 109, are formed on the second insulating layer 08 on both sides of the core substrate 102. The third wiring layers 110 can be formed using a process similar to the process by which the second wiring layers 107 are formed.

Figure 7A:
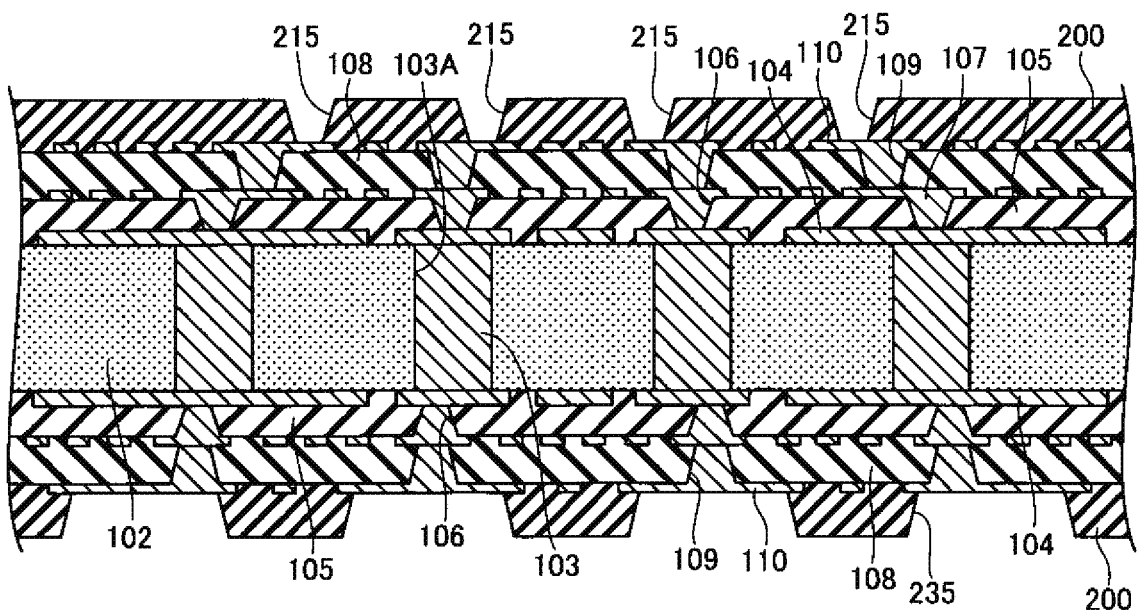
FIG. 7A is a sectional view showing the fabrication process of the wiring board according to the first embodiment.

Next, as shown in FIG. 7A, a solder resist layer 200 is formed on the second insulating layer 108 on both sides of the core substrate 102. Thereafter, via holes 215 are formed in the solder resist layer 200 on a side of the core substrate 102 where a semiconductor chip is connected, in such a manner as to reach connecting portions of the third wiring layers 110. Opening portions 235 are formed on the solder resist layer 200 on the side opposite the core substrate 102 in such a manner as to reach connecting portions of the third wiring layers 110.

Figure 7B:
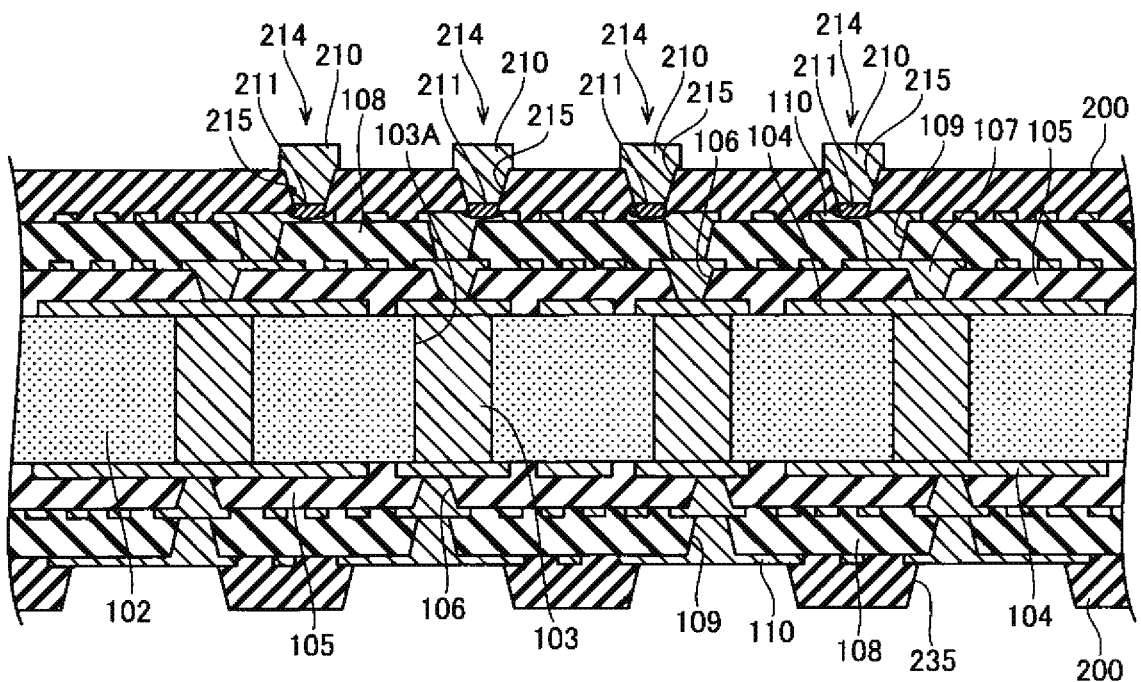
FIG. 7B is a sectional view showing the fabrication process of the wiring board according to the first embodiment.

Following this, as shown in FIG. 7B, recesses 111 are formed at the connecting portions of the third wiring layers 110 through the via holes 215 on the side of the core substrate 102 where a semiconductor chip is connected, and stacked bodies 214 each including an Ni plating layer 211 and a Cu post 210 are formed on the connecting portions of the third wiring layers 110.

The wiring board 100 according to the first embodiment can be fabricated in the way described heretofore.

Here, a forming process of the stacked body 214 will be described in detail. FIGS. 8A to 10B are sectional views showing a forming process of the stacked body 214.

Figure 8A:
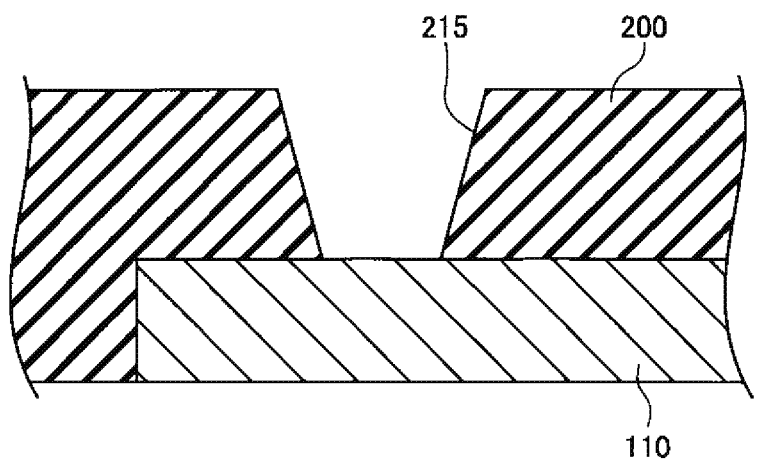
FIG. 8A is a sectional view showing a forming process of a stacked body included in the first embodiment.
Figure 8B:
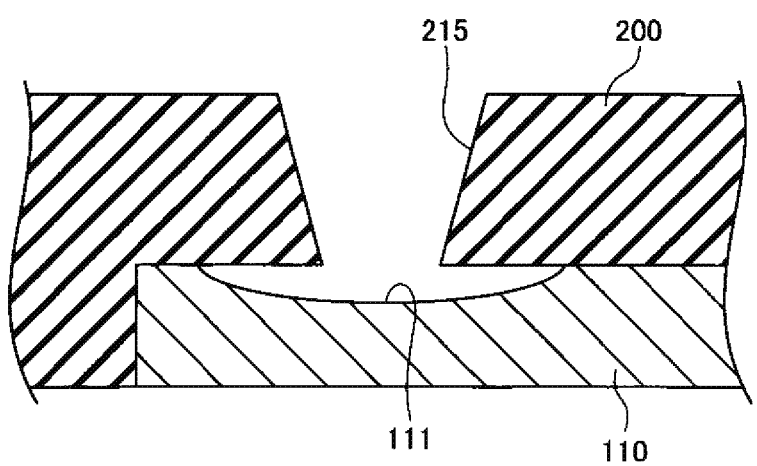
FIG. 8B is a sectional view showing the forming process of the stacked body included in the first embodiment.

After a via hole 215 is formed as shown in FIG. 8A, a recess 111 is formed on a surface of the third wiring layer 110 through wet etching as shown in FIG. 8B.

Figure 8C:
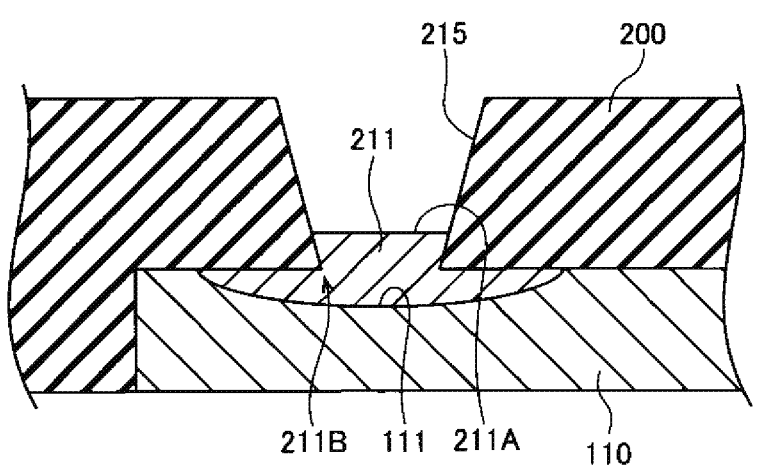
FIG. 8C is a sectional view showing the forming process of the stacked body included in the first embodiment.

Next, a Ni plating layer 211 is formed as shown in FIG. 8C. The Ni plating layer 211 is formed in such a manner as to fill the recess 111 and so that the upper surface 211A thereof is situated above the lower end of the via hole 215. The Ni plating layer 211 can be formed by an electroless plating process and has a thickness of 5 μm to 10 μm, for example.

Figure 9A:
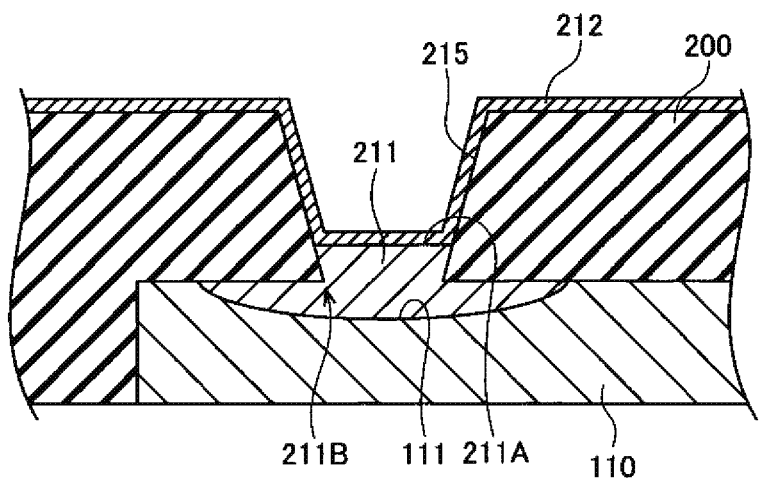
FIG. 9A is a sectional view showing the forming process of the stacked body included in the first embodiment.

Thereafter, as shown in FIG. 9A, a Cu seed layer 212 is formed. The Cu seed layer 212 can be formed by an electroless Cu plating process. A Pd plating layer and an Au plating layer are preferably formed sequentially on the Ni plating layer 211 in that order by an electroless plating process before the Cu seed layer 212 is formed.

Figure 9B:
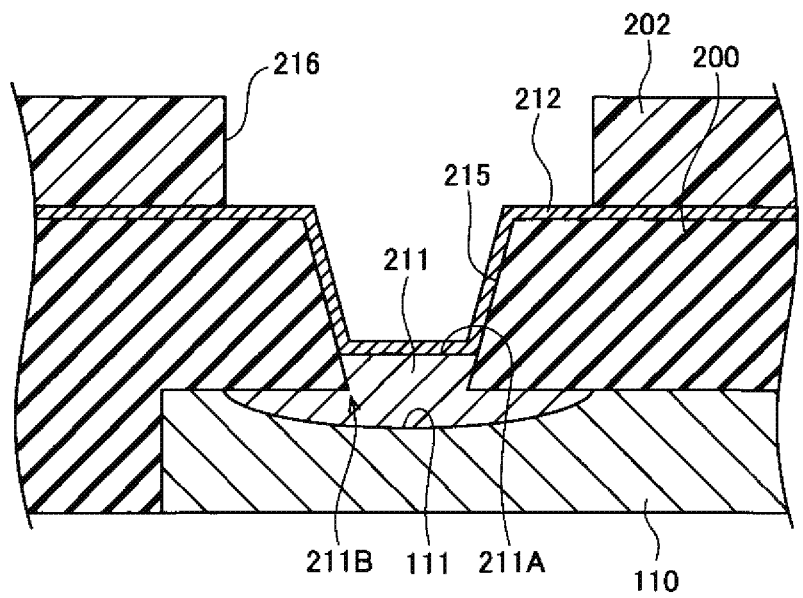
FIG. 9B is a sectional view showing the forming process of the stacked body included in the first embodiment.

Following this, as shown in FIG. 9B, a plating resist layer 202, in which an opening portion 216 is formed at a portion where a connecting terminal 210 is formed, is formed on the Cu seed layer 212. The opening portion 216 can be formed though a photo-lithography.

Figure 10A:
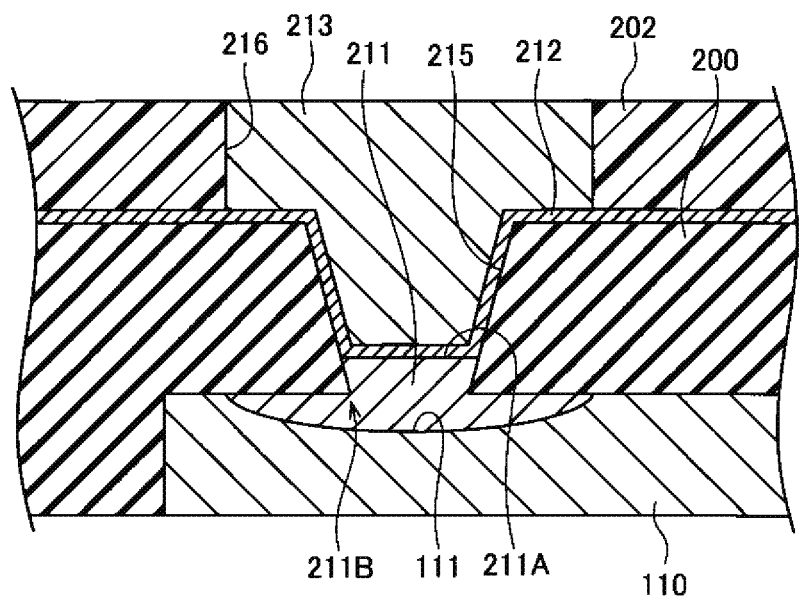
FIG. 10A is a sectional view showing the forming process of the stacked body included in the first embodiment.

Next, as shown in FIG. 10A, a Cu plating layer 213 is formed in the via hole 215 and the opening portion 216. The Cu plating layer 213 can be formed through an electrolytic plating process.

Figure 10B:
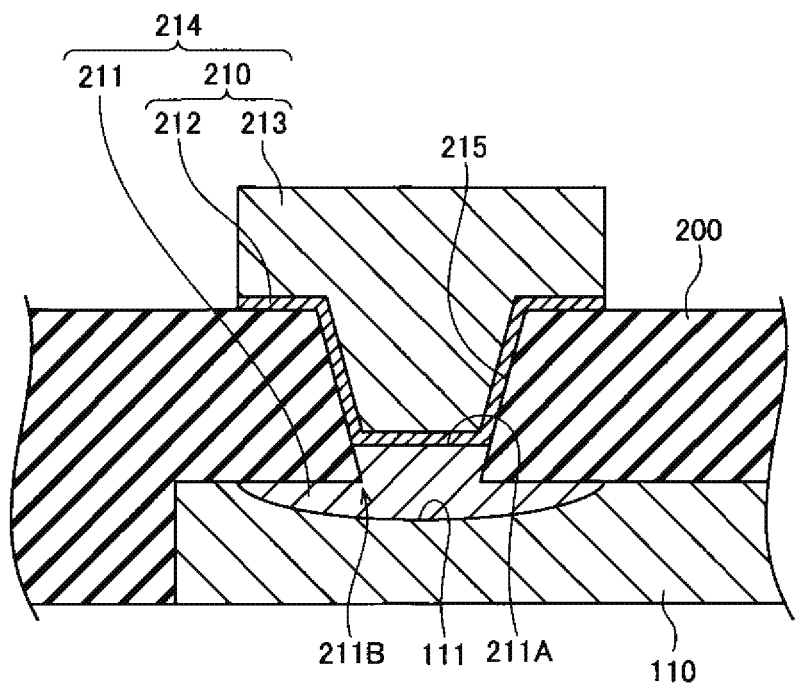
FIG. 10B is a sectional view showing the forming process of the stacked body included in the first embodiment.

Thereafter, as shown in FIG. 10B, the plating resist layer 202 is removed, and the Cu seed layer 212 is removed through wet etching using the Cu plating layer 213 as a mask.

In this way, the stacked body 214 of the Ni plating layer 211 and the Cu post 210 can be formed.

According to this fabrication process, the wiring board 100 having the Ni plating layer 211 provided at the appropriate portion can easily be fabricated.

The seed layer 212 is omitted in FIGS. 3 and 7B.

First Modified Example

Figure 11A:
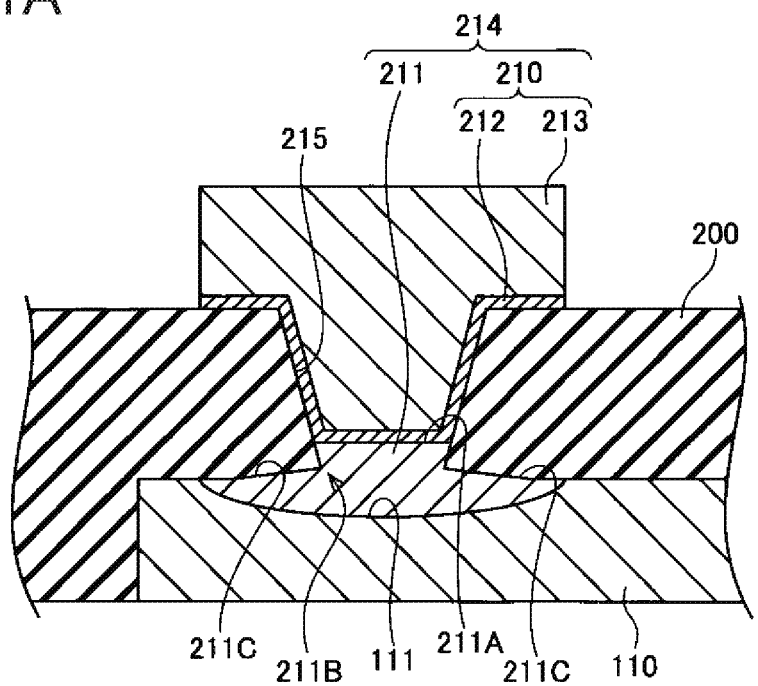
FIG. 11A is a sectional view showing the structure of a first modified example of a stacked body included in the wiring board according to the first embodiment.

As shown in FIG. 11A, a portion of a Ni plating layer 211 situated below a constricted portion 211B may be formed to have an expanded protruding shape. In this case, an upper surface 211C of third wiring layer 110 extending from the constricted portion 211B, that is, the interface with the solder resist layer 200, is inclined downward as it extends toward an outer edge thereof.

The more sharply the upper surface 211c is inclined, the less acute the angle formed by the upper side surface and the lower side surface of the constricted portion 211B becomes, whereby stress concentration to the vicinity of the constricted portion 211B tends to be mitigated.

Second Modified Example

Figure 11B:
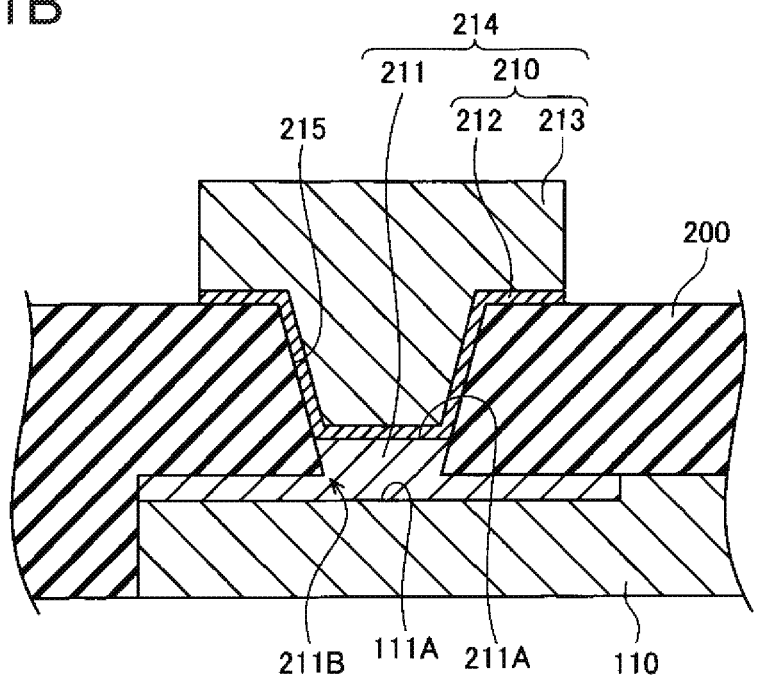
FIG. 11B is a sectional view showing the structure of a second modified example of a stacked body included in the wiring board according to first embodiment.

Instead of the bowl-shaped recess 111, a recess 111A having a flat bottom surface may be formed on a third wiring layer 110 as shown in FIG. 11B. Even in the case where the recess 111A is formed, the Ni plating layer 211 can advantageously enhance the strength and suppress a failure of the third wiring layer 110.

When comparing the recess 111 with the recess 111A, however, the recess 111 is preferred to the recess 111A in that a load exerted on the Ni plating layer 211 from above is easily scattered.

Second Embodiment

Figure 12:
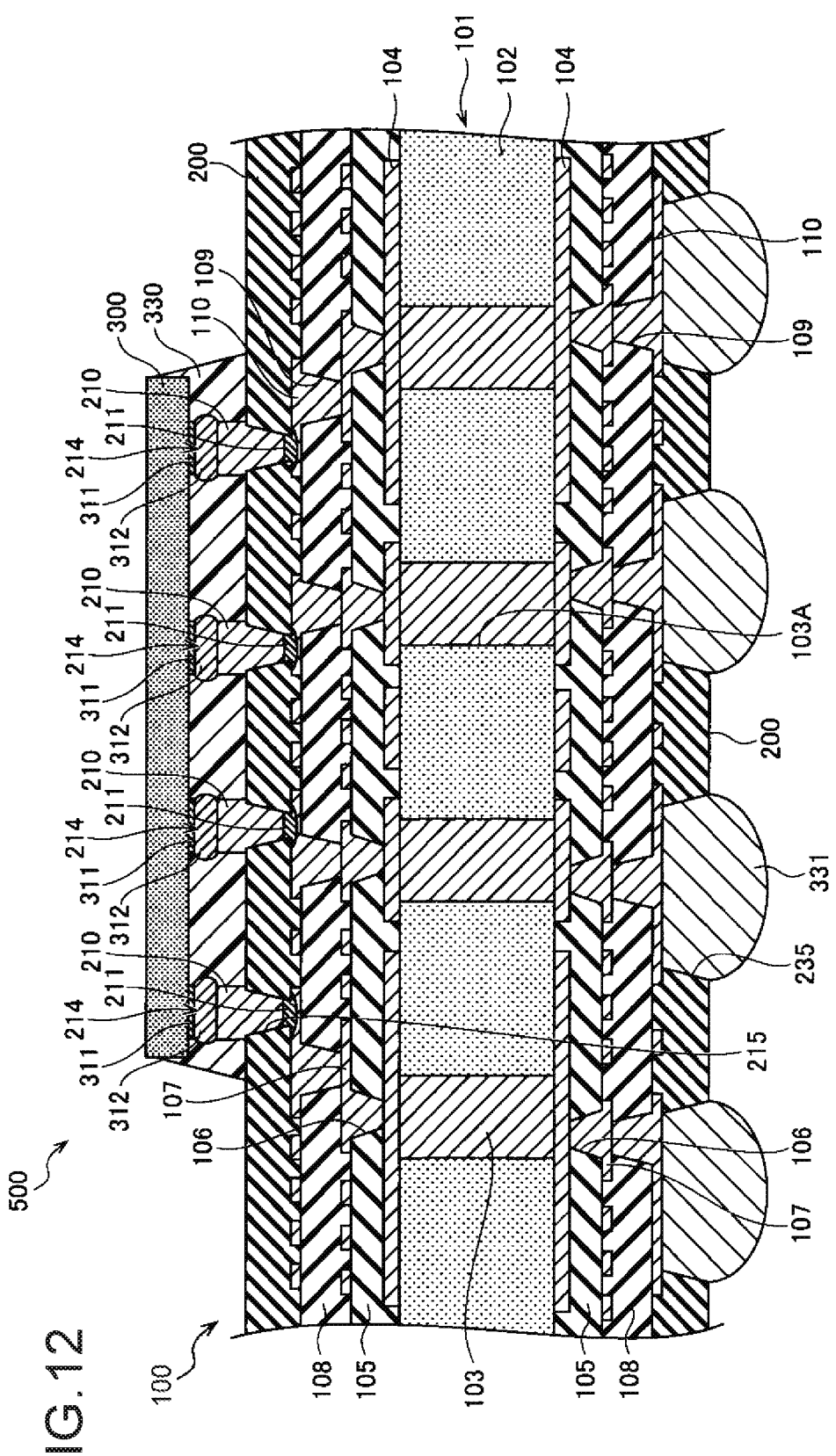
FIG. 12 is a sectional view showing a semiconductor package according to a second embodiment.

Next, a second embodiment will be described. The second embodiment relates to a semiconductor package. FIG. 12 is a sectional view showing a semiconductor package according to a second embodiment.

As shown in FIG. 12, a semiconductor package 500 according to the second embodiment includes the wiring board 100 according to the first embodiment, a semiconductor chip 300, bumps 312, an under fill resin 330, and external connecting terminals 331.

The semiconductor chip 300 includes a connecting terminal 311 which is connected to a Cu post 210 via the bump 312. The connecting terminal 311 is, for example, an electrode pad. For example, a solder ball is used for the bump 312. An unleaded solder such as a tin-zinc (SnZn) based alloy and a tin-copper (SnCu) based alloy, and a leaded solder such as a lead-tin (PbSn) based alloy are examples of materials for the solder ball. An under fill resin 330 of epoxy resin or the like is provided between the semiconductor chip 300 and the solder resist layer 200 of the wiring board 100.

The external connecting terminals 331 are provided on the third wiring layers 110 on the surface of the wiring board 100 opposite to the surface where the semiconductor chip 300 is connected. For example, a similar solder ball to that used for the bump 312 is used for the external connecting terminal 331.

To fabricate the semiconductor package 500, the semiconductor chip 300 is flip chip mounted on the wiring board 100 using the bumps 312. Following this, the under fill resin 330 is provided between the semiconductor chip 300 and the solder resist layer 200. Additionally, the external connecting terminals 331 are formed on the third wiring layers 110.

The semiconductor package 500 can be fabricated as described above.

In addition, there may be a case where the Ni plating layer 211 shown in FIG. 11A can be obtained by heat being applied to the wiring board 100 during a reflow performed when flip chip mounting the semiconductor chip 300.

Thus, while the preferred embodiments have been described in detail heretofore, the disclosure is not limited to the embodiments described above, and hence, various modifications or replacements can be made to the embodiments without departing from the scope of claims to be made below.

Various aspects of the subject matter described herein are set out non-exhaustively in the following numbered clauses:

1) A method of manufacturing a wiring board, the method comprising:
   forming an insulating layer to cover a Cu pad;
   forming an opening portion in the insulating layer such that a portion of the Cu pad is exposed through the opening portion;
   forming a recess in a surface of the Cu pad by wet etching the Cu pad through the opening portion;
   forming a first metallic layer in the recess and in the opening portion such that an upper surface of the first metallic layer is situated above a lower end of the opening portion;
   forming a seed layer on the first metallic layer; and
   forming a second metallic layer on the seed layer through an electrolytic plating process.

What is claimed is:

1. A wiring board comprising:
   a Cu pad;
   an insulating layer covering the Cu pad and having an opening portion formed on the Cu pad, the insulating layer having a lower surface facing the Cu pad and an upper surface opposite to the lower surface;
   a first metallic layer formed on the Cu pad in the opening portion, wherein an elastic modulus of the first metallic layer is higher than that of the Cu pad; and
   a connecting terminal formed on the first metallic layer to extend from the opening portion to above the upper surface of the insulating layer;
   wherein the connecting terminal comprises:
   a seed layer formed on the first metallic layer, a side wall surface of the insulating layer that defines the opening portion, and the upper surface of the insulating layer so as to extend from the first metallic layer to the upper surface of the insulating layer; and
   a second metallic layer formed on the seed layer, with a portion of the second metallic layer being disposed within the opening portion, and
   wherein a stacked body formed of the first metallic layer and the connecting terminal comprises a constricted portion, and
   wherein the constricted portion is located in a certain position of the first metallic layer in a thickness direction of the first metallic layer, and a sectional area of the stacked body is the smallest at the constricted portion.

2. The wiring board according to claim 1,
   wherein the second metallic layer comprises a Cu plating layer.

3. The wiring board according to claim 1,
wherein the first metallic layer comprises an Ni plating layer.

4. The wiring board according to claim 1,
wherein the first metallic layer comprises an inclined surface that is positioned between the constricted portion and the Cu pad and faces the insulating layer, and the inclined surface is inclined downward from the constricted portion.

5. The wiring board according to claim 1,
wherein a recess is formed in a surface of the Cu pad, and
a portion of the first metallic layer situated below the constricted portion is formed in the recess.

6. The wiring board according to claim 1,
wherein the insulating layer is a solder resist layer.

7. A semiconductor package comprising:
the wiring board according to claim 1; and
an electronic component mounted on the wiring board,
wherein the electronic component comprises a second connecting terminal connected to the connecting terminal.

8. A wiring board comprising:
a metallic pad;
an insulating layer covering the metallic pad and having an opening portion formed on the metallic pad, the insulating layer having a lower surface facing the metallic pad and an upper surface opposite to the back surface;
a first metallic layer formed on the metallic pad in the opening portion, wherein an elastic modulus of the first metallic layer is higher than that of the metallic pad; and
a connecting terminal formed on the first metallic layer to extend from the opening portion to above the upper surface of the insulating layer,
wherein the connecting terminal comprises:
a seed layer formed on the first metallic layer, a side wall surface of the insulating layer that defines the opening portion, and the upper surface of the insulating layer so as to extend from the first metallic layer to the upper surface of the insulating layer; and
a second metallic layer formed on the seed layer, with a portion of the second metallic layer being disposed within the opening portion, and
wherein a stacked body formed of the first metallic layer and the connecting terminal comprises a constricted portion, and
wherein the constricted portion is located in a certain position of the first metallic layer in a thickness direction of the first metallic layer, and a sectional area of the stacked body is the smallest at the constricted portion.

* * * * *